United States Patent
Tauber et al.

[11] Patent Number: 5,814,584
[45] Date of Patent: Sep. 29, 1998

[54] COMPOUND IN THE SERIES $A_2MeSBO_6$ FOR USE AS SUBSTRATES BARRIER-DIELECTRIC LAYERS AND PASSIVATING LAYERS IN HIGH CRITICAL TEMPERATURE SUPERCONDUCTING DEVICES

[75] Inventors: Arthur Tauber, Elberon; William D. Wilber, Neptune; Steven C. Tidrow, Eatontown; Robert D. Finnegan, West Long Branch; Donald W. Eckart, Wall, all of N.J.

[73] Assignee: The United States of America as represented by the Secretary of the Army, Washington, D.C.

[21] Appl. No.: 502,739

[22] Filed: Jun. 30, 1995

[51] Int. Cl.[6] .................................................. H01B 39/12

[52] U.S. Cl. .......................... 505/238; 505/237; 505/239; 505/701; 428/701; 428/702; 428/930

[58] Field of Search ................................ 505/238, 239, 505/237, 701; 428/688, 689, 701, 702, 930

[56] References Cited

PUBLICATIONS

Paulose et al., "Synthesis of $YBa_2SbO_6$: a possible new substrate for $YBa_2Cu_3O_{7-\delta}$ thin films" supercond. Sci Technology 5(1992) pp. 31–33.

Sleight et al, "Inorganic Chemistry", 3rd Ed., p. 292, 1964.

E.G. Fesenko et al, "Synthesis and Study of $A_2Sb^{5+}BO_6$ and $A_3Sb^{5+}BO_6$ Type Ternary Oxides with Perovskite Structure", Izvestia Akademii, Nauk SSSR, Neorganicheskie Materialy, 6(4), 800–802 (1970), Rostov, Gos. University, Rostov, USSR.

U. Wittman et al, "Uber die Ordnung von $_BIII$ und $M^V$ in Perowskiten vom Typ $A_{2''}B^{III}M^VO_6(A^{II}$=Ba, Sr; $M^V$=Sb, Nb, Ta)", Zeitschrift fuer Anorganische und Allgemeine Chemie, vol. 482, pp. 143–153 (1981).

*Primary Examiner*—Marie Yamnitzky
*Attorney, Agent, or Firm*—Michael Zelenka; George B. Tereschuk

[57] ABSTRACT

Compounds of the general formula $A_2MeSbO_6$ wherein A is either barium (Ba) or strontium (Sr) and Me is a non-magnetic ion selected from the group consisting of scandium (Sc), indium (In) and gallium (Ga) have been prepared and included in high critical temperature thin film superconductor structures.

2 Claims, 1 Drawing Sheet

COMPOUND IN THE SERIES $A_2MeSbO_6$ FOR USE AS SUBSTRATES BARRIER-DIELECTRIC LAYERS AND PASSIVATING LAYERS IN HIGH CRITICAL TEMPERATURE SUPERCONDUCTING DEVICES

GOVERNMENT INTEREST

The invention described herein may be manufactured, used, and licensed by or for the Government for governmental purposes without the payment to us of any royalties thereon.

RELATED APPLICATION

CECOM Docket No. 5304 entitled "Rare Earth Metal Compounds For Use in High Critical Temperature Thin Film Superconductors, Ferroelectrics, Pyroelectrics, Piezoelectrics, and Hybrids Including the Rare Earth Metal Containing Compounds," U.S. patent application Ser. No. 08/717,822, which has been partially assigned to the same assignee, has been filed in the United States Patent and Trademark Office and is related to this application.

FIELD OF INVENTION

The invention relates in general to dielectric substrates and barriers to be used in High Critical Temperature Superconducting microwave and millimeterwave devices, and in particular to new and useful compounds of the general formula $A_2MeSbO_6$ where A is either barium (Ba) or strontium (Sr) and Me is a non-magnetic ion selected from the group consisting of scandium (Sc), indium (In) and gallium (Ga).

BACKGROUND OF THE INVENTION

Heretofore, the best substrate or barrier dielectric in thin film superconductor technology has been $LaAlO_3$. However, there have been problems with the use of $LaAlO_3$. For one, its dielectric constant is too high, meaning that at high frequencies device features become unmanageably small. Another drawback of $LaAlO_3$ is its anisotropic dielectric constant which creates very difficult device calculations. It also undergoes a phase transition leading to twinning and stress. While many of these problems were overcome by CECOM Docket No. 5304, U.S. patent application Ser. No. 08/717,822, entitled "Rare Earth Metal Compounds For Use in High Critical Temperature Thin Film Superconductors, Ferroelectrics, Pyroelectrics, Piezoelectrics, and Hybrids," the rare earth metal compounds of that invention are magnetic, particularly at low temperatures, and losses may arise from the use of rare earth metals in those compounds. These magnetic problems are overcome in this invention when the rare earth metals are replaced by the non-magnetic ions where Me=Sc, In or Ga. Furthermore, lattice parameters in the $A_2MeSbO_6$ compounds disclosed in this invention provide a comparable or better fit to $YBa_2Cu_3O_{7-\delta}$ (YBCO) than the compounds disclosed in CECOM Docket No. 5304, U.S. patent application Ser. No. 08/717,822.

Prior art describing similar compounds is found at A. W. Sleight and R. Ward, *Inorganic Chemistry*, 3 rd edition, p. 292 (1964);

E. G. Fesenko, et. al., "Synthesis and Study of $A_2Sb^{5+}BO_6$ and $A_3Sb^{5+}BO_6$ Type Ternary Oxides with Perovskite Structure," Izvestia Akademii, Nauk SSSR, Neorganicheskie Materialy, 6(4), 800–2 (1970), Rostov, Gos. University, Rostov, USSR; and U. Wittman, et. al., "Uber die Ordnung von $B^{III}$ und $M^V$ in Perowskiten vom Typ $A_2''B'''M^VO_6 (A''=Ba, Sr; M^V=Sb, Nb, Ta)$," Zeitschrift fuer Anorganische und Allgemeine Chemie, vol. 482, pp. 143–153 (1981).

SUMMARY OF THE INVENTION

The general object of this invention is to provide materials that can be used as a substrate or barrier dielectric in thin film superconductor technology that can overcome the shortcomings of $LaAlO_3$. A more particular object of the invention is to provide a substrate or barrier dielectric with a low dielectric constant, a low dielectric loss and a material that does not undergo a phase transition that leads to twinning and stress. A further object of this invention is to provide compounds having non-magnetic ions which possess none of the disadvantages of utilizing rare earth metal compounds.

It has now been found that the aforementioned objects can be attained using a compound of the general formula $A_2MeSbO_6$ as the substrate or barrier dielectric in thin film superconductor technology. In the above formula, A can be either barium (Ba) or strontium (Sr) and Me is a non-magnetic ion selected from the group consisting of scandium (Sc), indium (In) and gallium (Ga). These compounds can be used as barrier or buffer layers and substrates in thin film high critical temperature superconducting structures.

BRIEF DESCRIPTION OF THE DRAWINGS

Other features and details of the present invention will become apparent in light of the Detailed Description of the Preferred Embodiment of the Invention and the accompanying FIG. 1 depicting X-ray diffraction spectra in the system $A_2MeSbO_6$ of the present invention.

DESCRIPTION OF THE PREFERRED EMBODIMENT

Figure 1:
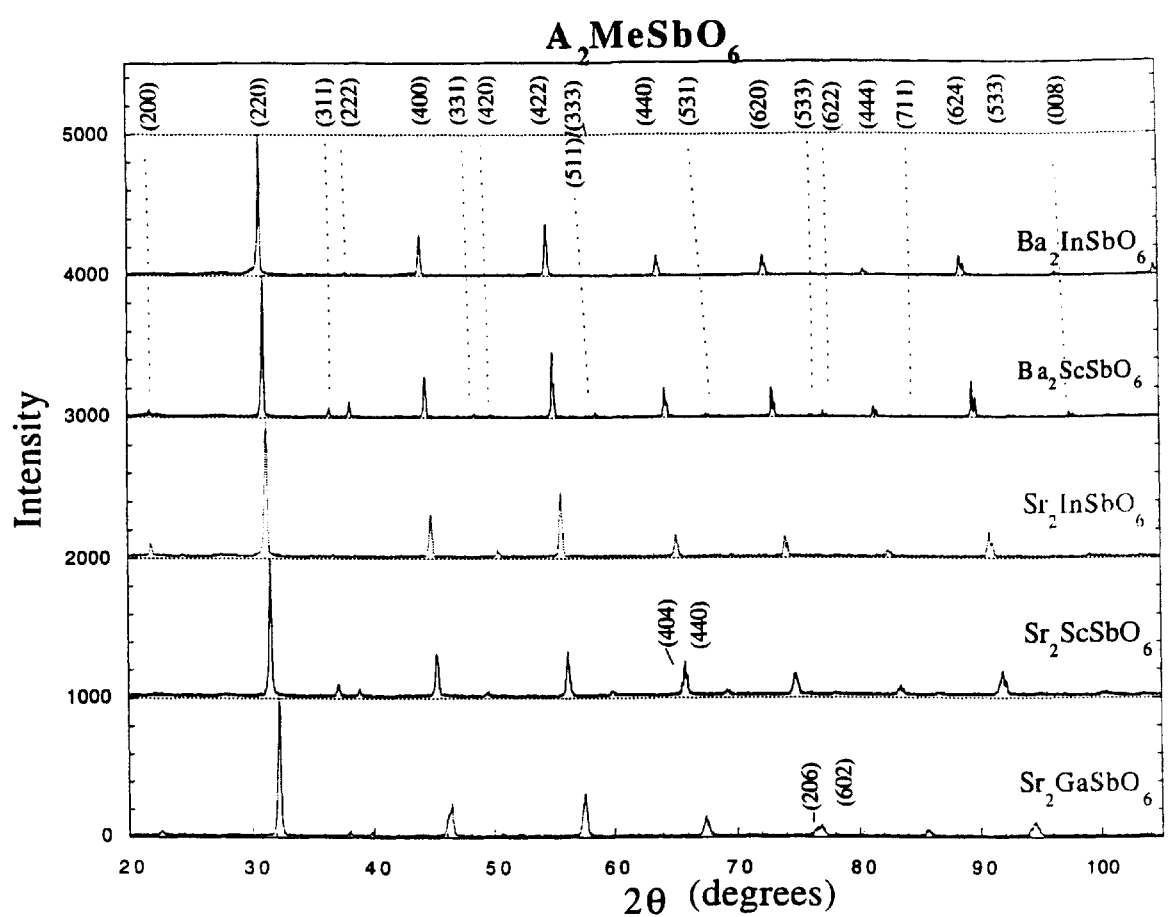

The following compounds in the series $A_2MeSbO_6$ have been synthesized for use as dielectric substrates, barrier layers or passivation layers in thin film high critical temperature superconductor devices:

TABLE I

| Compound | Lattice Parameters (A) | | Sinter Temp (°C.) | X-Ray Density | Dielectric const | Dielectric loss tan δ $(10^{-3})$ | color |
|---|---|---|---|---|---|---|---|
| | Measured | Literature | | | | | |
| $Ba_2InSbO_6$ | a = 4.174 | (4.128)** | 1300 | 5.96 | 6.9 | 20 | B |
| | a = 4.134 | (8.269)* | 1400 | | | | 1 |
| | | (4.136)! | | | | | |
| $Ba_2ScSbO_6$ | a = 8.172 | (8.203)! | 1400 | 5.36 | 8.1 | 6.5 | W |

TABLE I-continued

| Compound | Lattice Parameters (A) Measured | Lattice Parameters (A) Literature | Sinter Temp (°C.) | X-Ray Density | Dielectric const | Dielectric loss tan δ ($10^{-3}$) | color |
|---|---|---|---|---|---|---|---|
| | a = 8.196 | (4.096)** | 1600 | | | | |
| | | (8.197)* | | | | | |
| $Sr_2InSbO_6$ | a = 8.094 | (8.095)! | 1200 | 6.34 | 8.3 | <0.1 | W |
| | a = 8.096 | (4.051)** | 1400 | | | | |
| | a = 8.086 | | 1600 | | | | |
| $Sr_2ScSbO_6$ | a = 8.019 | (5.678)! | 1400 | 5.64 | 8.8 | 2.1 | W |
| | c = 8.063 | (5.691)! | | | | | |
| | | (8.021)! | | | | | |
| | | (4.011)** | | | | | |
| $Sr_2GaSbO_6$ | a = 7.860 | (a = 7.84)* | 1400 | 6.80 | 13.5 | 9.5 | W |
| | c = 7.910 | (c = 7.91)* | | | | | |
| | a = 7.880 | (7.892)! | 1500 | | | | |
| | c = 7.784 | (3.924)** | | | | | |

*A. W. Sleight and R. Ward, Inorganic Chemistry, 3 rd edition, p. 292 (1964);

Note that all compounds exhibit dielectric constants far superior (lower) than $LaAlO_3(\epsilon_r=22)$ and some superior to $MgO(\epsilon_6=10)$.

The bulk compounds were prepared by solid state reaction between $SrCO_3$ or $BaCO_3$ and $Sb_2O_3$ plus a sesquioxide $Sc_2O_3$, $In_2O_3$ and $Ga_2O_3$. All compounds were prepared as follows:

Stoichiometric amounts of precursor constituents were weighed out and mixed together in a mortar until a homogeneous powder was obtained. The powder was compacted into a disk and calcined at 1000° C. for 15 hours, then cooled to room temperature. The disk was ground in a mortar to a particle size of 100 μm or less, repressed into a disk, calcined at 1100° C. for 15 hours and cooled to room temperature. The repressed disk was ground to a particle size of 100 μm or less, pressed into a disk 1.25 inches in diameter, isostatically pressed at 60,000 psi, sintered at 1200°–1600° C. for 20–50 hours and cooled to room temperature.

In this connection, the term "by bulk" means dense sintered polycrystalline bodies from 1 to 1.25 inches in diameter and about 0.125 to 0.25 inches in thickness. X-ray diffractometer spectra were run to confirm that each disk is single phase in composition. These diffraction spectra are compared in FIG. 1. Lattice parameters are determined from the indexed powder pattern and are listed in Table I. In all instances, the resulting compounds formed had the perovskite structure.

When the formed compound exhibited an ordered cubic perovskite structure, a subcell and a supercell were observed in some instances. The most probable space group in this case is Fm3m. A lattice parameter for the subcell was determined from even hkl reflections and the lattice parameter for the superlattice was obtained from odd hkl reflections. Further, the lattice constant contracted as the sintering temperature increased. All barium compounds were cubic and $Ba_2ScSbO_6$ was ordered while $Ba_2InSbO_6$ was found not to be ordered. Of the strontium compounds, only $Sr_2InSbO_6$ was cubic and though it was ordered, the supercell reflections were very weak. $Sr_2GaSbO_6$ and $Sr_2ScSbO_6$ were ordered in a tetragonal, or pseudo-cubic, manner. The splitting of some of the reflections is depicted in FIG. 1.

$LaAlO_3$ and MgO are often used as substrates on which high critical temperature superconductors such as YBCO films are grown for device applications. The lattice mismatch for heteroepitaxial growth of YBCO on $LaAlO_3$ is outstanding, about 1%, while for MgO it is about 7%. The mismatch in lattice parameter for $A_2MeSbO_6$ compounds epitaxially grown on YBCO is given in TABLE II, below.

TABLE II

| | % MISFIT TO YBCO | | |
|---|---|---|---|
| COMPOUND | a-LATTICE PARAMETER | % MISFIT TO a YBCO | % MISFIT TO b YBCO |
| $Ba_2InSbO_6$ | a = 4.174 | 8.2 | 6.2 |
| $Ba_2ScSbO_6$ | a = 8.196 | 7.2 | 5.3 |
| $Sr_2InSbO_6$ | a = 8.086 | 5.8 | 3.9 |
| $Sr_2ScSbO_6$ | a = 8.019 | 4.9 | 3.0 |
| $Sr_2GaSbO_6$ | a = 7.880 | 3.1 | 1.3 |

Only the $Sr_2GaSbO_6$ compound compares favorably with $LaAlO_3$, while all compounds but $Ba_2ScSbO_6$ are superior to MgO and its equivalent. Except for $Ba_2ScSbO_6$, all of the compounds exhibit parameter fits that are superior to the rare earth metal compounds described in the above-referenced CECOM Docket No. 5304 patent application, U.S. patent application Ser. No. 08/717,822. Additionally, all compounds disclosed in this invention are superior to the previously disclosed compounds because these compounds do not contain magnetic ions. Generally, magnetic ions might contribute to dielectric loss at low temperature.

The experimental conditions used to obtain single and multilayered structures by laser ablation are to deposit thin films of $A_2MeSbO_6$ using the pulsed laser deposition technique. The KrF laser (λ=248 nm) parameters were a pulse repetition rate of 10 Hz and a laser fluence of 1–2 J/cm² at the target, unless noted otherwise in Table III, below.

TABLE III

| | | Substrate | | Oxygen Pressure | Block Temp |
|---|---|---|---|---|---|
| Sample # | Compound | MgO | YBCO/MgO | (mTorr) | (°C.) |
| 895 | $Ba_2InSbO_6$ | X | X | 150 | 800 |
| 894 | $Ba_2ScSbO_6$ | X | X | 1 | 500 |
| 883 | $Sr_2ScSbO_6$ | X | X | 1 | 400 |
| 881 | $Sr_2ScSbO_6$ | X | X | 1 | 400 |
| 880 | $Sr_2ScSbO_6$ | X | X | 1 | 300 |
| 869 | $Sr_2ScSbO_6$ | | X | 15 | 550 |
| 868 | $Sr_2ScSbO_6$ | | X | 1 | 500 |
| 852 | $Sr_2InSbO_6$ | | X | 30 | 600 |
| 826 | $Sr_2GaSbO_6$ | | X | 170 | 800 |

TABLE III-continued

| Sample # | Compound | Substrate MgO | Substrate YBCO/MgO | Oxygen Pressure (mTorr) | Block Temp (°C.) |
|---|---|---|---|---|---|
| 815 | $Sr_2ScSbO_6$ | X | X | 170 | 800 |
| 814 | $Sr_2GaSbO_6$ | X | X | 130 | 800 |

Analysis of X-Ray diffraction data obtained from single layer films of $A_2MeSbO_6$ on (100)MgO reveals that the 400 reflection of the perovskite phase, when ordered, or the 200 reflection, when not ordered, are the most intense. Similarly, when $Sr_2MeSbO_6$ is deposited on YBCO(001)/(100)MgO, 400 or 200 is the most intense reflection of the perovskite film. Specific results are given in TABLE IV, below.

TABLE IV

| | OBSERVED X-RAY REFLECTIONS | | | |
|---|---|---|---|---|
| | | | Antimonate | |
| STRUCTURE | YBCO | MgO | Reflection | Intensity |
| $Ba_2InSbO_6$/Mgo | | 200 | 100 | very weak |
| | | 400 | 110 | very weak |
| | | | 200 | very strong |
| | | | 400 | weak |
| $Ba_2InSbO_6$/YBCO/MgO | 002 | 200 | 200 | very strong |
| | 003 | | | |
| | 004 | | | |
| | 005 | | | |
| | 006 | | | |
| | 113 | | | |
| | 007 | | | |
| | 008 | | | |
| $Ba_2ScSbO_6$/MgO | | 200 | 200 | medium |
| | | | 220 | weak |
| | | | 400 | very strong |
| | | | 422 | very weak |
| | | | 444 | very weak |
| $Ba_2ScSbO_6$/YBCO/MgO | 003 | 200 | 200 | weak |
| | 004 | | 400 | very strong |
| | 005 | | 600 | very weak |
| | 006 | | | |
| | 007 | | | |
| | 008 | | | |
| | 009 | | | |
| | 00, 11 | | | |
| $Sr_2InbO_6$/Mgo | | 200 | 200 | medium |
| | | | 220 | weak |
| | | | 400 | strong |
| | | | 422 | weak |
| | | | 440 | weak |
| $Sr_2InSbO_6$/YBCO/MgO | 002 | 200 | 200 | medium |
| | 003 | 400 | 220 | weak |
| | 004 | | 400 | very strong |
| | 005 | | 600 | very weak |
| | 006 | | | |
| | 007 | | | |
| | 008 | | | |
| | 009 | | | |
| | 00, 10 | | | |
| | 00, 11 | | | |
| $Sr_2ScSbO_6$/MgO | | 200 | 200 | very weak |
| | | | 220 | strong |
| | | | 222 | very weak |
| | | | 400 | medium |
| | | | 422 | very weak |
| | | | 440 | very weak |
| | | | 444 | very weak |
| $Sr_2ScSbO_6$/YBCO/MgO | 003 | 200 | 200 | weak |
| | 004 | 400 | 220 | very weak |
| | 005 | | 400 | very strong |
| | 007 | | | |
| | 008 | | | |
| | 009 | | | |
| $Sr_2GaSbO_6$/MgO | | 200 | 200 | very weak |
| | | | 220 | very weak |
| | | | 311 | very weak |
| | | | 400 | very strong |
| | | | 440 | very weak |
| | | | 620 | very weak |
| | | | 642 | very weak |
| $Sr_2GaSbO_6$/YBCO/MgO | 002 | 200 | 200 | very weak |
| | 003 | 400 | 400 | very strong |
| | 004 | | | |
| | 005 | | | |
| | 006 | | | |
| | 007 | | | |
| | 009 | | | |
| | 00, 10 | | | |
| | 00, 11 | | | |

Microwave measurements of the real and imaginary parts of the dielectic constant were performed at approximately 9.32 and 10.1 Ghz and room temperature. A cavity perturbation technique was used with a reflection-type, rectangular cavity excited in the $TE_{106}$ mode for 9.3 GHZ. The cavity was coupled to the waveguide by an adjustable iris having a 0.5 mm side by 35 mm long slot, which was cut along the center of one of the broad sides, providing access for the thin, rectangular samples. The samples were held so that their long dimension is parallel to the E-field of the cavity and they were positioned at the E-field maximum as determined by maximizing the shift of the cavity.

The real part of the dielectric constant was calculated from the shift in resonance frequency of the cavity due to the sample, and the imaginary component was calculated from a change in cavity Q. The accuracy of these measurements depends upon two general sources of error: (1) the accuracy of the cavity characterization; and (2) material properties such as density and uniformity of shape. The error due to the cavity characterization results in an accuracy of approximately +2% for the real part of the dielectric constant, and limits the resolution of the loss tangent, which is the imaginary component divided by the real component of the dielectric constant to approximately 0.001. The margin of error due to material properties and sample shape can be considerably greater than the cavity characterization error, particularly the error due to low material density.

The compounds of the system $A_2MeSbO_6$ are cubic and $Ba_2ScSbO_6$ is ordered, while $Ba_2InSbO_6$ was found to be disordered. The occurrence of ordering probably depends mostly upon thermal treatment which differs in each case. The dielectric constants are much lower than $LaAlO_3$ (22–25) and range from 5–16.

In the foregoing disclosure, the term "high critical temperature thin film superconductor device" means a copper oxide superconductor having a critical temperature in excess of 30° K. Such thin film high $T_c$ superconductor devices, or structures, may include arrangements where materials of the compounds of the present invention in various forms are advantageously interspersed with a layer constructed of a high $T_c$ superconductive material. In such an arrangement, the materials disclosed herein can be stacked in two basic configurations: dielectric substrate, thin high $T_c$ film layer and thin film made with the same material as the dielectric substrate, or, in the alternative, dielectric substrate, thin film made of same material and then thin high $T_c$ film layer. Examples of such superconductors are: $REBa_2Cu_3O_{7-\delta}$, $REBa_2Cu_4O_8$ where RE is a rare earth element and $0 \leq \delta \leq 1$, $Tl_2Ca_2Ba_2Cu_3O_{10}$, $Tl_1Ca_2Ba_2Cu_3O_9$ and $Tl_2Ba_2Ca_1Cu_2O_8$ and the series containing Hg compounds: $HgBa_2Ca_{n-1}Cu_nO_{2+2n+x}$ $1 \leq n \leq 6$, $HgSr_2Ca_{n-1}Cu_nO_{2+2n+y}$ $1 \leq n \leq 6$ $HgSr_2Cu(Me)O_y$ where Me=Cr, Mo, Re, Y and $Hg_{1-x}M_xBa_2Ca_{n-1}Cu_nO_{2n+1}$ where M=Bi, Pb, rare earth $1 \leq m \leq 6$.

The term "single layer device" refers to a device including a single layer of high critical temperature superconducting ferroelectric, pyroeletric, piezoelectric, or ferromagnetic material. The term "multilayer device" refers to a device including at least two layers of a high critical temperature superconductor, ferroelectric, pyroeletric, piezoelectric, dielectric or ferromagnetic layers.

High critical temperature superconducting, dielectric, ferroelectric, pyroelectric, piezoelectric, and ferromagnetic materials and the compounds of this invention can be used in devices including flux flow transistors, current limiters, broadband impedance transformers, diodes, delay lines, resonators, antenna, antenna feeds, switches, phase shifters, mixers, amplifiers, balometers and magneto-resistors.

The compounds of the invention can be made in the form of a bulk single crystal substrate, a dense polycrystalline disc, a crystalline expitaxial thin film or a polycrystalline thin film. In their manufacture, some form of laser ablation is preferred, but the compounds can also be made by techniques such as sputtering, MOCVD, MBE, evaporation, and so on. The compounds of the present invention can be used in bulk form to serve as targets for the deposition of thin films by such methods as sputtering or laser ablation. The thin films may serve as dielectric buffer layers or dielectric substrates in single and multilayer structures. As single crystals the compounds of this invention can be used as bulk substrates.

The following examples illustrate uses of the $A_2MeSbO_6$ compounds of this invention.

An antenna can be made according to the invention by depositing a single layer of high critical temperature superconductor (HTSC) directly onto a single crystal $Sr_2ScSbO_6$ substrate or a substrate of other composition buffered with a layer of $Sr_2ScSbO_6$. The HTSC is then patterned to complete the device.

A superconductor insulator superconductor step edge Josephson junction, which is a multilayer superconducting device, is fabricated according to the invention using $Sr_2InSbO_6$. More particularly, the device is made by depositing a single layer of HTSC on a single crystal $Sr_2InSbO_6$ substrate or a substrate of other composition buffered with a layer of $Sr_2InSbO_6$. Next, the HTSC is patterned by ion milling at a 45° angle. A layer of $Sr_2InSbO_6$ is then deposited. Next, another HTSC layer is deposited and patterned to complete the device.

We wish it to be understood that we do not desire to be limited to the exact details of construction shown and described for obvious modifications will occur to a person skilled in the art.

What we claim is:

1. A thin film high $T_c$ structure comprising thin films of a compound of the general formula $A_2MeSbO_6$ wherein A is barium or strontium and Me is a non-magnetic ion selected from the group consisting of scandium, indium and gallium interspersed with a layer of a copper oxide superconductor.

2. A thin film high $T_c$ structure as recited in claim 1 wherein said A is strontium.

* * * * *

UNITED STATES PATENT AND TRADEMARK OFFICE
CERTIFICATE OF CORRECTION

PATENT NO : 5,814,584
DATED : Sep. 29, 1998
INVENTOR(S): Arthur Tauber, William D. Wilber, Steven C. Tidrow, Robert D. Finnegan, Donald W. Eckart It is certified that error appears in the above-identified patent and that said Letters Patent is hereby corrected as shown below:

Column 3, line 20, insert the following:

-- **  E.G. Fesenko, et. al., "Synthesis and Study of $A_2Sb^{5+}BO_6$ and $A_3Sb^{5+}BO_6$ Type Ternary Oxides with Perovskite Structure," Izvestia Akademii, Nauk SSSR, Neorganicheskie Materialy, 6(4), 800-2 (1970), Rostov, Gos. University, Rostov, USSR; and !  U. Wittman, et. al., "Uber die Ordnung von $B^{III}$ und $M^V$ in Perowskiten vom Typ $A_2^{II}B^{III}M^VO_6 (A^{II}$=Ba, Sr; $M^V$=Sb, Nb, Ta)," Zeitschrift fuer Anorganische und Allgemeine Chemie, vol. 482, pp. 143-153 (1981).--

Column 3, line 23, change "$MgO(\varepsilon_6 = 10)$" to read --$MgO(\varepsilon_r = 10)$--.

Signed and Sealed this

Twenty-first Day of September, 1999

Attest:

Q. TODD DICKINSON

*Attesting Officer*   *Acting Commissioner of Patents and Trademarks*